(12) United States Patent
Bedeschi

(10) Patent No.: US 8,953,360 B2
(45) Date of Patent: Feb. 10, 2015

(54) APPARATUS AND METHOD FOR READING A PHASE-CHANGE MEMORY CELL

(75) Inventor: Ferdinando Bedeschi, Milan (IT)

(73) Assignee: Micron Technology, Inc., Boise, ID (US)

( * ) Notice: Subject to any disclaimer, the term of this patent is extended or adjusted under 35 U.S.C. 154(b) by 424 days.

(21) Appl. No.: 13/514,532

(22) PCT Filed: Dec. 10, 2009

(86) PCT No.: PCT/IT2009/000557
§ 371 (c)(1),
(2), (4) Date: Oct. 11, 2012

(87) PCT Pub. No.: WO2011/070599
PCT Pub. Date: Jun. 16, 2011

(65) Prior Publication Data
US 2013/0040584 A1 Feb. 14, 2013

(51) Int. Cl.
*G11C 13/00* (2006.01)
*G11C 11/56* (2006.01)

(52) U.S. Cl.
CPC .......... *G11C 13/004* (2013.01); *G11C 11/5678* (2013.01); *G11C 13/0004* (2013.01); *G11C 2013/0054* (2013.01); *G11C 2213/72* (2013.01)
USPC .......................................... 365/148; 365/158

(58) Field of Classification Search
CPC ........................ G11C 11/1675; G11C 13/0002
USPC .................................................. 365/148, 158
See application file for complete search history.

(56) References Cited

U.S. PATENT DOCUMENTS

2004/0151023 A1* 8/2004 Khouri et al. ................. 365/163
2010/0271868 A1* 10/2010 Park ............................. 365/163

FOREIGN PATENT DOCUMENTS

| EP | 1538632 A1 | 6/2005 |
| WO | WO-2009134664 A2 | 11/2009 |
| WO | WO-2011070599 A1 | 6/2011 |

OTHER PUBLICATIONS

"International Application Serial No. PCT/IT2009/000557, International Search Report mailed Mar. 10, 2010", 3 Pgs.

* cited by examiner

*Primary Examiner* — Michael Tran
(74) *Attorney, Agent, or Firm* — Schwegman Lundberg & Woessner, P.A.

(57) ABSTRACT

An apparatus and a method for reading a phase-change memory cell are described. A circuit includes a current ramp circuit. A current forcing module is coupled with the current ramp circuit. A Veb emulation circuit is coupled with the current forcing module by a voltage adder, the voltage adder to sum an output from the Veb emulation circuit and a high impedance voltage source. A method includes forcing a current ramp into both a bitline and a dummy bitline, the dummy bitline having a voltage. The method also includes tripping a comparator when the current ramp provides a storage voltage with a predefined value, the storage voltage associated with the phase-change memory cell, and the predefined value independent from a resistance value of the phase-change memory cell and added in series to the voltage of the dummy bitline.

20 Claims, 13 Drawing Sheets

APPARATUS AND METHOD FOR READING A PHASE-CHANGE MEMORY CELL

PRIORITY APPLICATION

This application is a U.S. National Stage Filing under 35 U.S.C. 371 from International Patent Application Ser. No. PCT/IT2009/000557, filed 10 Dec. 2009, and published as WO/2011/070599 A1 on 16 Jun. 2011, which is incorporated herein by reference in its entirety.

TECHNICAL FIELD

Embodiments of the invention are in the field of phase-change memory cells and, in particular, apparatuses and methods for reading phase-change memory cells.

BACKGROUND

Embedded SRAM and DRAM have problems with non-volatility and soft error rates, while embedded FLASH memories require additional masking layers or processing steps during manufacture, require high-voltage for programming, and have issues with endurance and reliability. Phase-Change Memory (PCM) overcomes the criticality of the above mentioned parameters and exhibits favorable write speeds, small cell sizes, simpler circuitries and a fabrication compatibility with the Complementary Metal-Oxide-Semiconductor (CMOS) process. However, additional improvements are needed in the evolution of the PCM technology.

DETAILED DESCRIPTION

Figure 1:
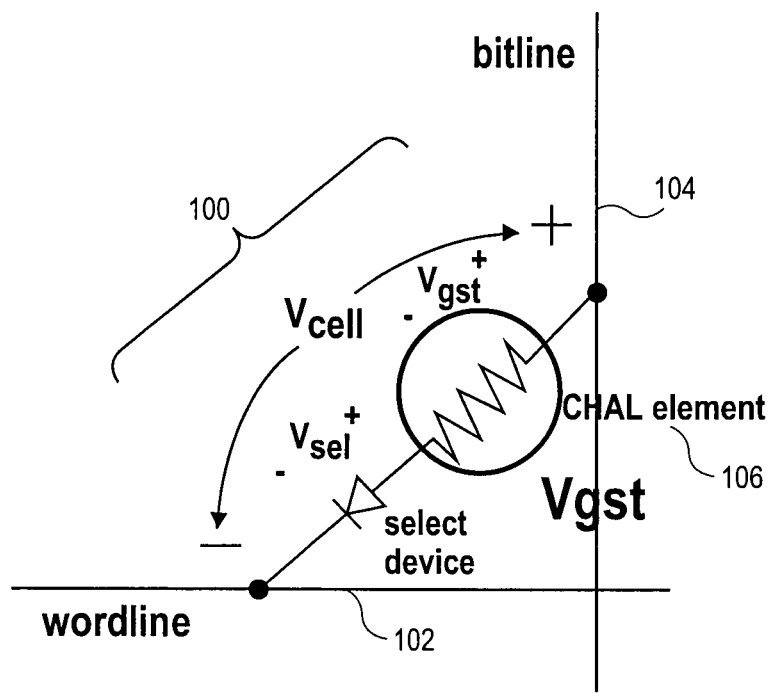
FIG. 1 illustrates a schematic representing conventional PCM cell biasing.

An apparatus and a method for reading a phase-change memory cell are described herein. In the following description, numerous specific details are set forth, such as specific circuit configurations, in order to provide a thorough understanding of embodiments of the present invention. It will be apparent to one skilled in the art that embodiments of the present invention may be practiced without these specific details. In other instances, well-known processing operations, such as material processing operations, are not described in detail in order to not unnecessarily obscure embodiments of the present invention. Furthermore, it is to be understood that the various embodiments shown in the Figures are illustrative representations and are not necessarily drawn to scale.

Disclosed herein is an apparatus for reading a phase-change memory cell. In one embodiment, a circuit includes a current ramp circuit. A current forcing module is coupled with the current ramp circuit. A Veb emulation circuit is coupled with the current forcing module by a voltage adder, the voltage adder to sum an output from the Veb emulation circuit and a high impedance voltage source.

Also disclosed herein is a method for reading a phase-change memory cell. In one embodiment, a method includes forcing a current ramp into both a bitline and a dummy bitline, the dummy bitline having a voltage. The method also includes tripping a comparator when the current ramp provides a storage voltage with a predefined value, the storage voltage associated with the phase-change memory cell, and the predefined value independent from a resistance value of the phase-change memory cell and added in series to the voltage of the dummy bitline. In one embodiment, the predefined value is independent from a resistance value of the phase-change memory cell and it is obtained using a dummy bitline, a dummy wordline and a dummy cell (or any emulation of them) in which the same current ramp is forced at the same time, coupled together with an high impedance voltage source generating a safe voltage.

In accordance with embodiment of the present invention, references may be made to (1) a cell voltage, (2) a storage voltage, and (3) a selector voltage. In an embodiment, cell voltage (Vcell) is the voltage applied to the series of the storage and the selector, often being assumed equal to bitline voltage (Vbl) if neglecting the contributions of line parasitics, and to the bitline and wordline selectors, where the wordline voltage is assumed equal to zero when a cell is selected. In an embodiment, storage voltage (Vgst) is the fraction of the cell voltage which drops upon the chalcogenide and its heater. In an embodiment, selector voltage (Vsel) is the fraction of the cell voltage which drops upon the selector (e.g., on a diode, bipolar, or MOS transistor, etc.).

Conventional cell biasing techniques, such as forcing a bitline voltage and comparing the cell current against a reference one, may not achieve an acceptable read window for multi-level cell (MLC) devices, or even for single-level cell (SLC) devices with tight lithography constraints. This effect is due to a voltage drop across the selector, the voltage drop modifying the forced voltage available to bias the storage and, hence, being the storage voltage different from the desired, the available current signal which has to be compared against a reference for a reliable data storage reading will be affected too. For example, the lower the resistance of an MLC device or SLC device with tight lithography constraints, the smaller the storage voltage and the smaller the storage signal. In another example, the higher the resistance of an MLC device or SLC device with tight lithography constraints, the larger the storage voltage and again the smaller the available signal. Such an effect may impact both the read window size for, and reliability of, the device. In accordance with an embodiment of the present invention, the above observations are addressed by using a biasing technique based on a current ramp and a dummy bitline with a proper voltage added in series. In one embodiment, the current ramp causes a comparator to trip when the storage voltage reaches a given, safe, predefined value. In a specific embodiment, the predefined value is independent from the resistance value of the device. In accordance with an embodiment of the present invention, a dummy bitline is used, the dummy bitline having a properly adjusted voltage and a current equal to the current flowing into the device.

Read window budget (RWB) issues may impact Phase-Change Memory (PCM) devices. A PCM is a kind of resistor which can be altered to provide different resistance values. MLC sensing techniques and circuits may require the largest possible read window (signal). For example, a voltage may be forced in a bitline, a current read, and a delta determined between the signal and a reference. In accordance with an embodiment of the present invention, unlike Flash memories where a selector is the storage, PCM requires a dedicated switch in series with a storage element. As such, with conventional bitline biasing techniques, the voltage dropping on a selector needs to be subtracted from the bitline voltage, reducing the available signal. In particular, for example, the more the device or cell is set, the lower the available voltage, and the smaller the window becomes. Also, the more the device or cell is reset, the higher the available voltage, and the smaller the window becomes. This may lead to a higher risk of disturbing the device or cell by exceeding its safe operating voltage.

FIG. 1 illustrates a schematic representing conventional PCM cell biasing. Referring to FIG. 1, a conventional PCM cell 100 is associated with a wordline 102 and a bitline 104. The wordline voltage (Vwl) is few hundreds of mVolts (e.g., approximately 0 Volts) when the cell is selected, while the bitline voltage is approximately equal to the cell voltage Vcell, if neglecting the line parasitics and the column decoder drops. PCM cell 100 has a voltage (Vcell) which includes contribution from a chalcogenide phase-change element 106 in the form of the voltage associated with the chalcogenide phase-change material (Vgst) and the selector contribution (e.g., in this case, the drop on the diode, Veb in other cases along the text, or more generally Vsel). Vgst is approximately 0 Volts (actually a few hundred mVolts, e.g. approximately in the range of 150-200 mV) when the chalcogenide phase-change material is crystalline and the bitline is biased around 1.2V. On the other hand, under the same biasing conditions, it is around 400 mV (or greater) if the chalcogenide is in the amorphous state. Otherwise, Vgst can be calculated by subtracting Vcell (which is very close to the bitline voltage Vbl) from the voltage of the selector (Vsel). More importantly, Vgst depends on the impedance ratio between the diode and the storage, which is ultimately a resistor provided by, e.g., an amorphous or a crystalline chalcogenide phase-change material. In addition, the safe operating voltage and current (Vsafe, Isafe) are equal to the maximum voltage or current for Vgst which do not induce any disturb along with reading cycles.

Figure 2:
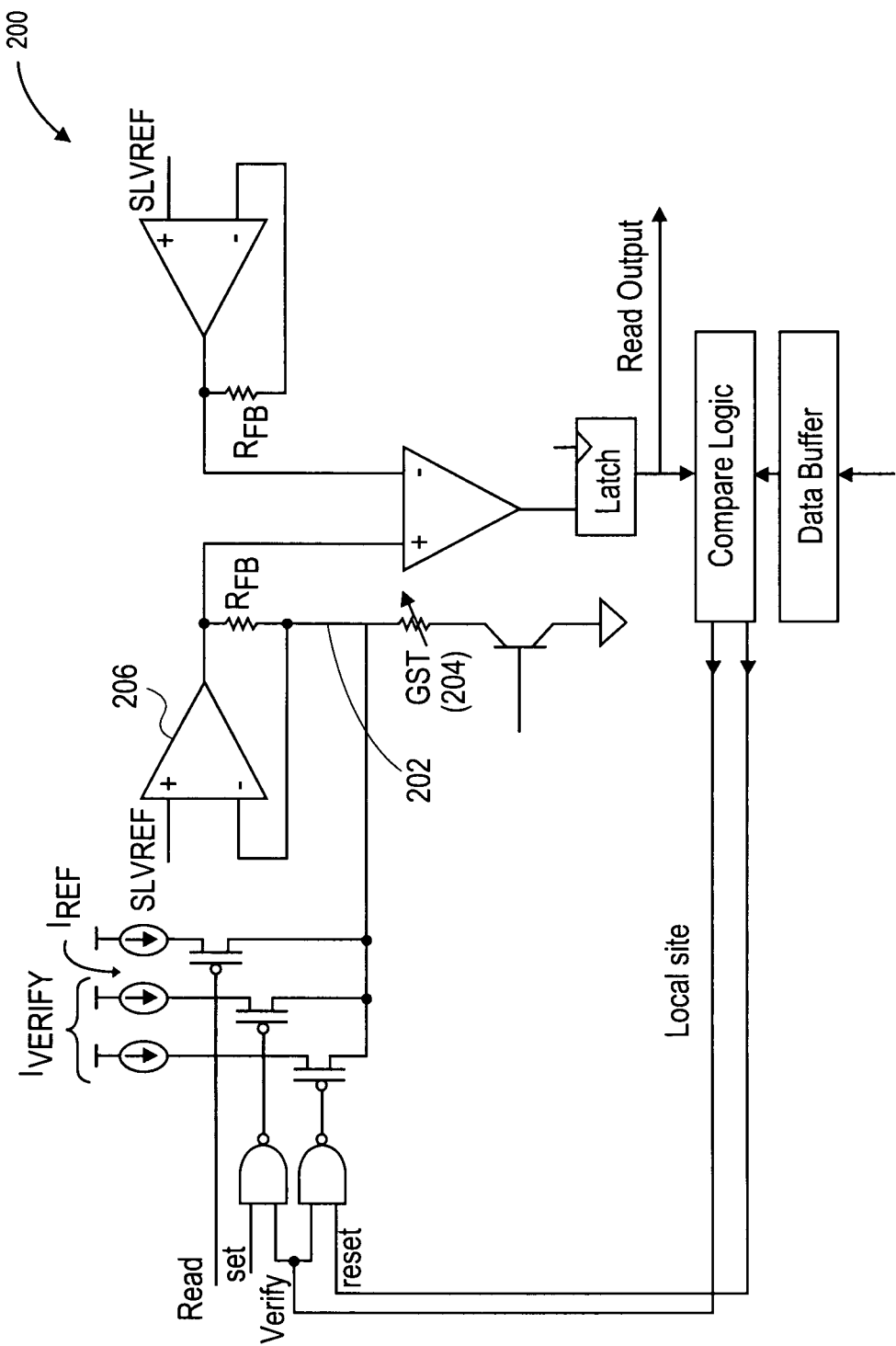
FIG. 2 illustrates a schematic representing conventional column biasing for a PCM cell.

FIG. 2 illustrates a schematic representing conventional column biasing for a PCM cell. Referring to FIG. 2, a portion of a circuit 200 includes a bitline 202 and a chalcogenide phase-change element 204 (GST). The bitline voltage (Vbl) is equally to Vsafe added to the product of an emitter base voltage and the maximum current (Isafe). This voltage (SLVREF), whose generation is not shown in the drawings as representing the state of art, is imposed by an operational amplifier 206. The voltage of the chalcogenide phase-change material (Vgst) is equal to SLVREF less the cell emitter base voltage calculated at the cell current (Icell). Vgst is also equal to the product of the resistance of the chalcogenide phase-change material (Rgst) and Icell (as shown and described in association with FIG. 1). According to the cell state, the output of the operational amplifier 206 may be greater or smaller than SLVREF. For example, if the cell is well set, the cell current is given by the read reference current coming from the current generator plus the additional current provided by the amplifier and flowing through the $R_{FB}$ resistor. Thus, the output is larger than SLFREF. On the other hand, if the cell is well reset, part of the read reference current flows into the $R_{FB}$, thus the output of the amplifier is lower than SLVREF. The data is sensed by the comparison of the output of the two amplifiers, which are used to have a matched pair. This comparison is based on a further conversion of the current signal into a voltage signal performed by resistors $R_{FB}$. In this arrangement, Vgst could be greater than or smaller than Vsafe. For example, in one embodiment, Vgst is greater than Vsafe if the cell is well reset, whereas Vgst is less than Vsafe if the cell is well set.

Figure 3:
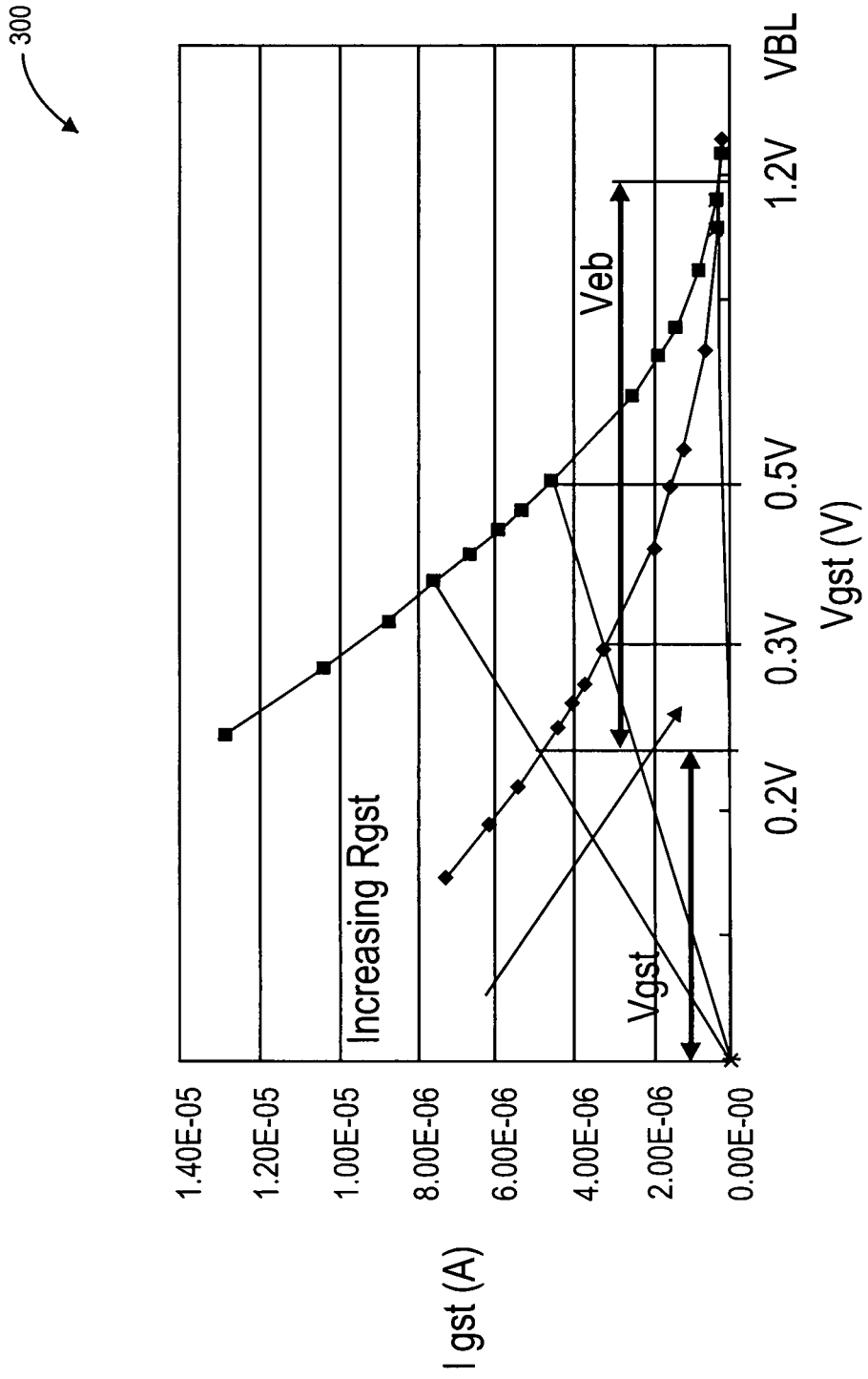
FIG. 3 is a plot of current of a chalcogenide phase-change material (Igst) as a function of the voltage and the resistance of a chalcogenide phase-change material (Vgst), under a conventional PCM sense amplifier bitline voltage biasing with the cell selector being the loadline (Veb), in accordance with an embodiment of the present invention.

FIG. 3 is a plot 300 of current of a chalcogenide phase-change material (Igst) as a function of the voltage and the resistance of a chalcogenide phase-change material (Vgst), under a conventional PCM sense amplifier bitline voltage biasing with the cell selector being the loadline (Veb), in accordance with an embodiment of the present invention. In an embodiment, plot 300 represents a conventional PCM sense amplifier biasing, such as the sense amplifier biasing described in association with FIG. 2) and with the non linear loadline given by the selector. Referring to FIG. 3, the bitline voltage (Vbl, which is approximately 1.2V when no current is flowing) is equal to the sum of an emitter base voltage (Veb) at the Igst current and the storage voltage Vgst. In response to an increasing resistance of the chalcogenide phase-change material (Rgst), Vgst increases, and vice versa. Thus, the available current signal, e.g., Vgst_set/Rgst_set-Vgst_reset/Rgst_reset, is affected by Veb, where 'set' represents the crystalline phase (logic "1") of the chalcogenide phase-change material and 'reset' represents the amorphous phase (logic "0") of the chalcogenide phase-change material. Hence, Vgst increases indicates an increase in amorphous character of the chalcogenide phase-change material and vice versa. One additional consideration is that there may be bipolar variations across cell arrays, represented in FIG. 3 as different non linear loadlines.

In considering the above arrangements, an available window may be compared to a real window. For example in accordance with an embodiment of the present invention, suppose the minimum reset resistance is 200 K, the maximum set resistance is 20 K, Vsafe is 400 mV, and Vbl is 1.2 V. The available window is 400 mV/20 K-400 mV/200K, which is approximately 18 microAmps. In an embodiment, consideration is taken that a Veb of 950 mV is needed when 12.5 microAmps flows into the cell, while a Veb of 0.7V is required when the cell current Icell is 2.5 microAmps. Veb includes into the selector voltage also the wordline parasitics and the wordline drivers drops. Thus, the real window is approximately equal to 250, mV/20K-500 mV/200K, which is approximately equal to 12.5 microAmps-2.5 microAmps, or 10 microAmps. The approximately 8 microAmps difference between the real window and the available window is due to the manner in which the bitline is biased and to the voltage drop upon the selector, which in one case lowers the Vgst while in the other increases it. This difference is a very large loss, and could otherwise be used to place inner states in an MLC device.

Considering the above issues of conventional PCM reading methods, in accordance with an embodiment of the present invention, a dummy bitline is used in an apparatus and a method for reading a phase-change memory cell. In one embodiment, a chalcogenide phase-change material is included in the dummy bitline and set to a proper state, for example during chip wafer testing (it will be referred to as Rgstd). In another embodiment, the dummy bitline does not include a chalcogenide phase-change material. In that embodiment, a dummy cell essentially includes only a bipolar selector. In both cases, a Vsafe voltage is generated and added in series to a dummy bitline. Instead of fixing the bitline voltage, in one embodiment, a current ramp is forced into both the actual bitline and the dummy bitline. The selector of the dummy cell belonging to the dummy bitline is assumed to match the properties of the selector of the matrix cell belonging to the selected bitline, a part negligible process spreads. Accordingly, in an embodiment, if the current forced into the bitline and the dummy bitline have the same value, the emitter base voltage developed upon the dummy selector and the emitter base voltage of the cell selector will be approximately equal.

In one embodiment, the ramp starting point is at a minimum current of Vsafe/Rreset_min and the ramp stopping point is at a maximum current of Vsafe/Rset_max. In an embodiment, the voltage developed at the top of the series of a dummy selector of the dummy bitline, e.g. a diode, and the Vsafe generator when the current ramp is forced (RIN) is compared with the matrix bitline voltage (SIN). Thus, in a particular embodiment, the current will eventually reach a given value that renders the cell storage voltage equivalent to Vsafe. In particular, if no dummy chalcogenide Rgstd is present, then the bitline voltage is the SIN=Rgst*I+Veb(I), while the dummy voltage is RIN=Vsafe+Veb(I). Note that the cell selector Veb voltage and the dummy selector Veb have been assumed equal. In an embodiment, at this point (SIN=RIN, that means Rgst*I=Vsafe), the comparator used for the comparison will trip and a signal which stops the current ramp will be generated. The content of the cell is read out and latched at the point at which the trip occurs. As such, in a specific embodiment, the sooner the trigger occurs, the greater extent to which the bit is reset, and vice versa. Thus, in accordance with an embodiment of the present invention, each cell, whatever its state, is biased until the voltage dropping on it is equal to Vsafe, thus maximizing the window and the reliability. If the dummy chalcogenide were present, the trip will happen at that given current I where the cell storage is Vsafe+Rgstd*I, thus again independent from cell resistance. This additional contribution (Rgstd*I) will further increase the real window despite some potential reliability issues in the case of an MLC device, but poses no issues in an SLC device. For that reason, a dummy compensator resistor may be added on the cell branch just between the top of the column selector and the SIN node, as described below.

Figure 4:
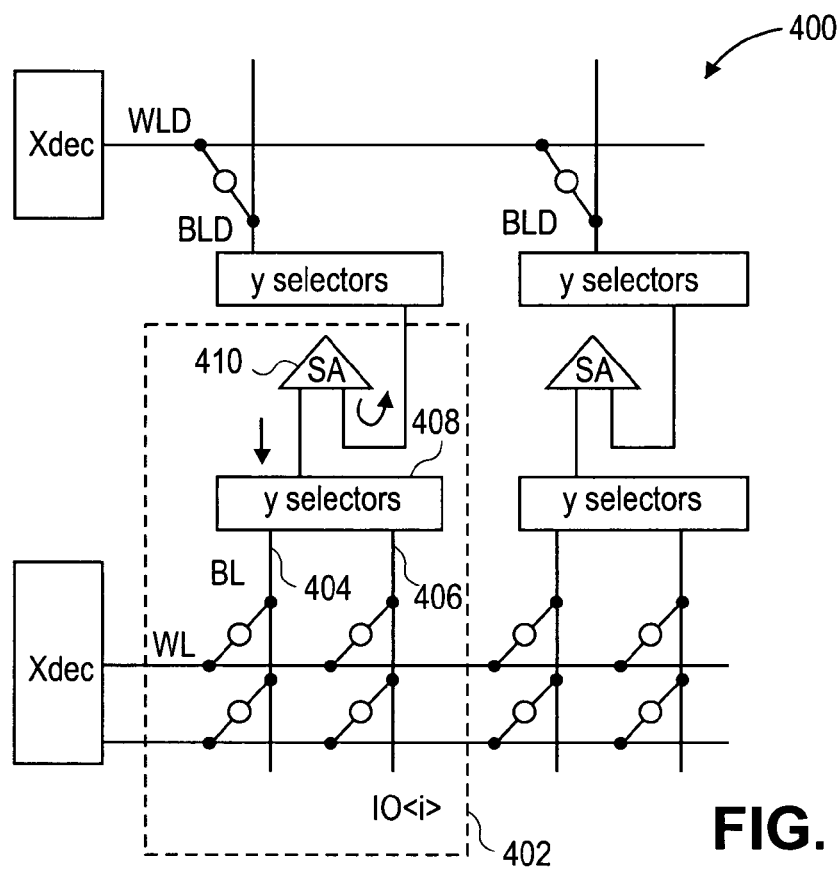
FIG. 4 illustrates a circuit diagram of an apparatus for reading a phase-change memory cell, the circuit including a portion with a dummy bitline and a dummy wordline, in accordance with an embodiment of the present invention.

FIG. 4 illustrates a circuit diagram of an apparatus for reading a phase-change memory cell, the circuit including a portion with a dummy bitline (BLD) and a dummy wordline (WLD), in accordance with an embodiment of the present invention. Referring to FIG. 4, a circuit 400 includes memory cells selected by proper X and Y decoders and connected to sense amplifiers 410 for reading. A dummy bitline BLD, and its dummy cell at the cross between BLD and WLD, is associated to the given sense amplifier 410 of the given input-output IO<i> 402. The BLD is used by all the cells belonging to the bitlines of the IO such as 404 or 406 (at any selected WL) according to the particular address issued to the memory. The dummy bitline is selected at the same time which any of the 404 or 406 are selected in and it is connected by the path 408 to the sense amplifier. In an embodiment, although not shown, the dummy bitlines (one per IOs) and the dummy wordline (shared across all the IOs) can be merged inside the bitlines and the wordlines of a non selected memory array plane in order to best match the selector properties, such as Veb.

Figure 5:
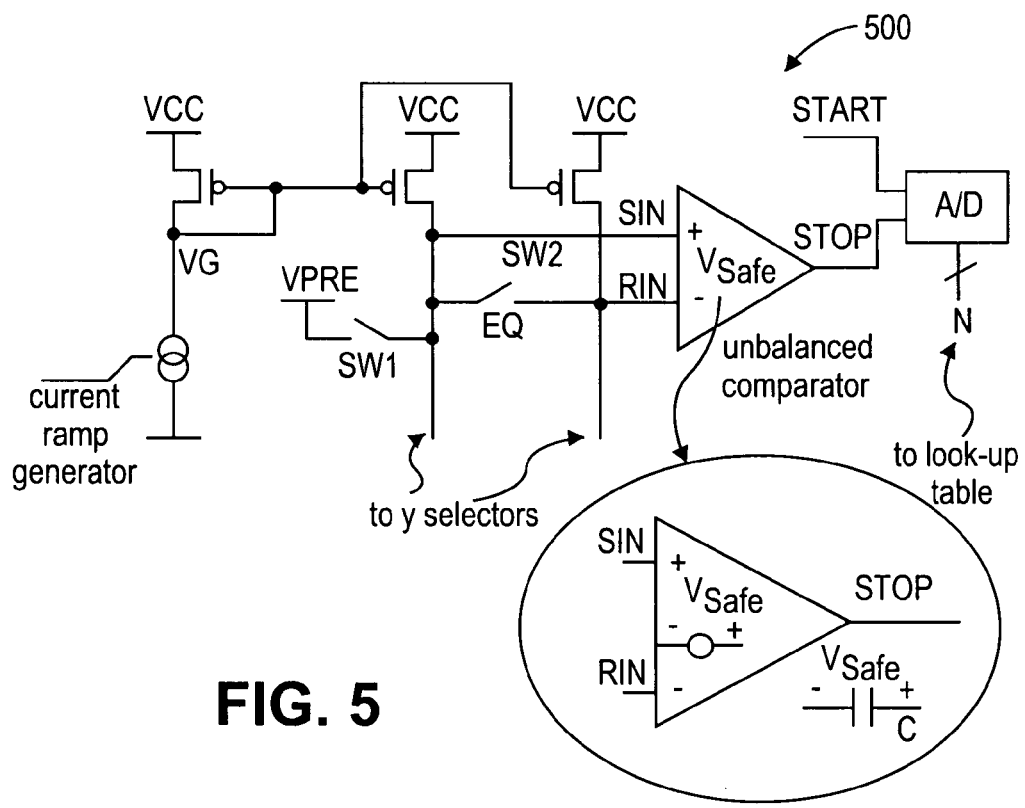
FIG. 5 illustrates a layout of a sense amplifier for reading a phase-change memory cell which is biasing both the selected bitline (connected to SIN) and the dummy bitline (connected to RIN) using an unbalanced comparator to read the data (the unbalanced comparator triggers when SIN is equal to or greater than RIN+Vsafe, Vsafe being the unbalancing voltage quantity), in accordance with an embodiment of the present invention.

FIG. 5 illustrates a layout of a sense amplifier for reading a phase-change memory cell which is biasing both the selected bitline (connected to SIN) and the dummy bitline (connected to RIN) using an unbalanced comparator to read the data (the unbalanced comparator triggers when SIN is equal to or greater than RIN+Vsafe, Vsafe being the unbalancing voltage quantity), in accordance with an embodiment of the present invention. In an embodiment, the sense amplifier represents the SA 410 described in association with FIG. 4. In particular, referring to FIG. 5, a sense amplifier 500 includes two switches, SW1 and SW2. In an embodiment, switch SW1 and SW2 are closed during pre-charge of sense-amplifier 500 connecting SIN and RIN to a pre-charge voltage VPRE, while switch SW2 equalizes SIN and RIN when the bitline and the dummy bitline, e.g. bitline 404 or 406 and BLD from FIG. 4, are charged and when SW1 is opened. SIN is connected by the Y decoder to the array cell while RIN is connected to the dummy cell by the Y decoders along the path 408 in FIG. 4. Both switches are opened when the current ramp starts. The current ramp is forced through VG into bitline and dummy bitline by the classical current mirror configuration. In this case, the comparator is assumed unbalanced, e.g., it will trip when SIN is equal to or larger than RIN+Vsafe, being Vsafe the designed offset. Unbalancing the comparator adds a Vsafe voltage to the dummy cell voltage which is essentially the dummy selector voltage drop plus, eventually, the dummy chalcogenide drop (on Rgstd), as described above.

There are many possibilities for generating an unbalanced comparator, although none are depicted with much detail in FIG. 5. For example, in an embodiment, a pre-charged capacitor (with the proper polarity) at Vsafe can be put in series between RIN and the minus terminal. In another embodiment, a reference current is injected into one leg of the classical input pair which realizes the differential stage of a comparator. In other embodiments, a variety of arrangements may be used for the switches SW1 and SW2 or current mirrors configurations (e.g., cascoded mirrors).

Referring again to FIG. 5, an Analog to Digital converter (A/D) receives the trigger (stop) from the output of the comparator (SIN equal to or larger than RIN+Vsafe). This trigger, which follows after some time the start signal representing the start of the current ramp, is used to store a given digital representation (N) of the current itself which is sent to a look-up table which finally converts this value into a logical state. It is to be understood that with the above approach, in accordance with an embodiment of the present invention, a current is forced and a current is read. By contrast, by convention, a voltage is forced and a current is read or a current is forced and a voltage is read.

Figure 6A:
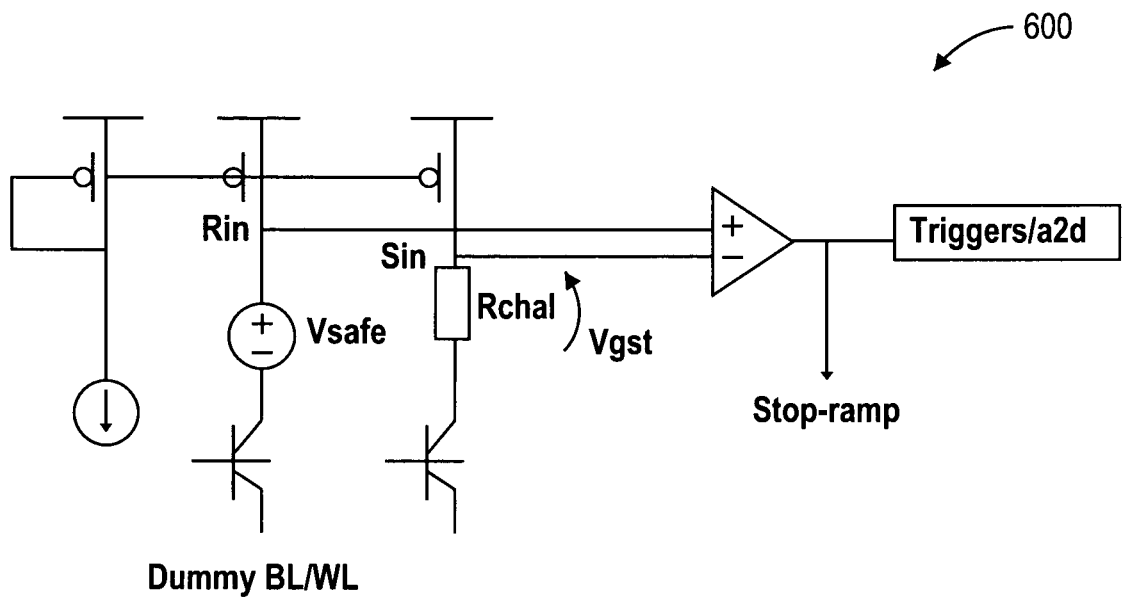
FIG. 6A illustrates a conceptual schematic of a current scan for reading a phase-change memory cell, in accordance with an embodiment of the present invention.
Figure 6B:
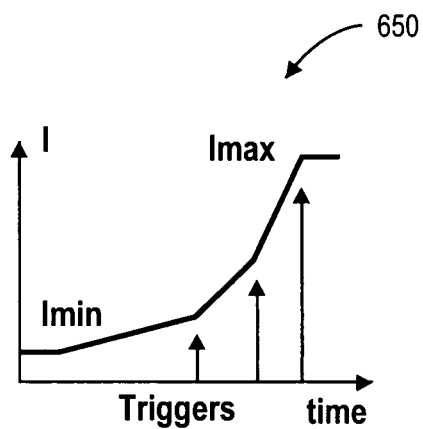
FIG. 6B illustrates a plot of current ramp as a function of time associated with the current scan of FIG. 6A, in accordance with an embodiment of the present invention.

FIG. 6A illustrates a more conceptual schematic with respect to the subject of FIGS. 4 and 5. In particular, FIG. 6A illustrates a current scan for reading a phase-change memory cell, in accordance with an embodiment of the present invention. FIG. 6B illustrates a plot 650 of current ramp as a function of time associated with the current scan of FIG. 6A, in accordance with an embodiment of the present invention. Referring to FIG. 6A, a conceptual schematic 600 of a current scan for reading a phase-change memory cell is configured to trigger when the voltage of a chalcogenide phase-change material (Vchal), which is on Rchal, is equal to Vsafe which is added in series on top of the dummy bitline, here represented as a pure bipolar selector (without dummy chalcogenide Rgstd). In an embodiment, data is latched, a ramp is stopped locally, and a bitline is discharged or is floated for noise margin. Referring to FIG. 6B, Imin is equal to Vsafe/Rreset min, while Imax is equal to Vsafe/Rset max. In an embodiment, a read of an associated cell, such as a MLC or SLC, is based on a time event or, more likely, a predetermined trip value. In one embodiment, the bitlines (+sin/rin) are pre-charged and equalized at a value Vpre.

Figure 7A:
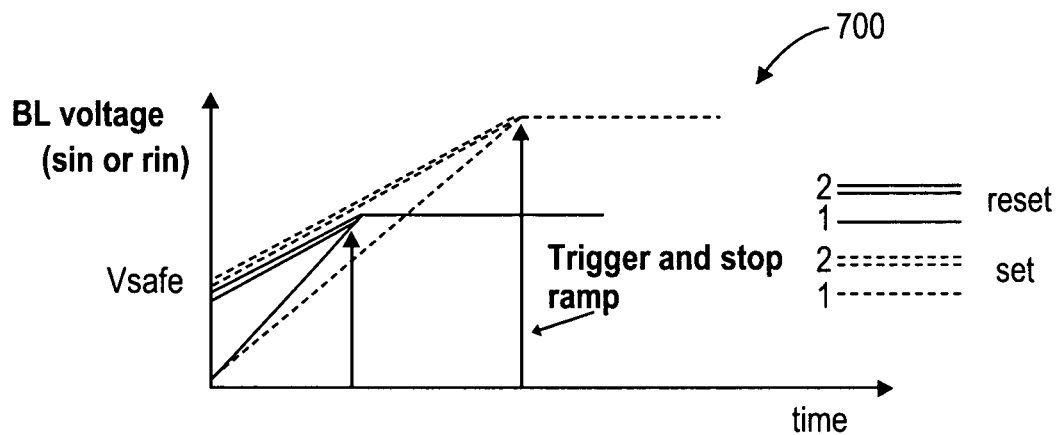
FIG. 7A illustrates a conceptual schematic of the bitline and dummy bitline voltages during the current scan for reading a phase-change memory cell, in accordance with an embodiment of the present invention.
Figure 7B:
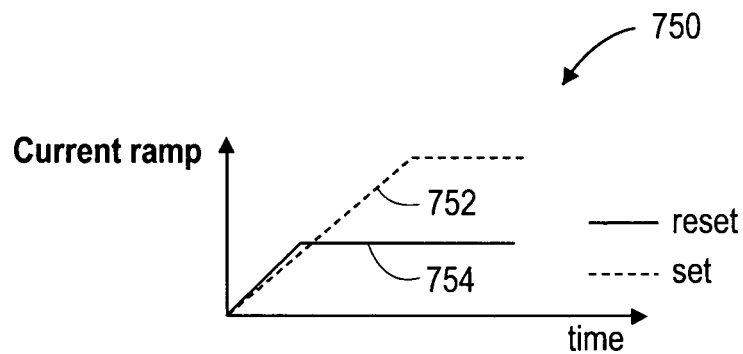
FIG. 7B illustrates a plot of current ramp as a function of time associated with the current scan of FIG. 7A, in accordance with an embodiment of the present invention.

FIG. 7A illustrates a conceptual schematic of the bitline and dummy bitline voltages during the current scan for reading a phase-change memory cell, in accordance with an embodiment of the present invention. FIG. 7B illustrates a plot 750 of current ramp as a function of time associated with the current scan of FIG. 7A, in accordance with an embodiment of the present invention. Referring to FIG. 7A, a conceptual schematic 700 of a current scan for reading a phase-change memory cell depicts current for a cell (1) and an associated dummy cell (2). The dashed lines and solid lines represent set and reset states, respectively. In an embodiment, the bitline voltage, e.g. sense voltage Vsin, is equal to the addition product of the resistance of a chalcogenide phase-change portion of a cell (Rchal) times the current of the cell and the emitter base voltage. In another embodiment, the bitline voltage, e.g. reference voltage Vrin, is equal to the addition product of Vsafe and the emitter base voltage. The voltage of an associated comparator is equal to Vsin minus Vrin. In accordance with an embodiment of the present invention, the comparator trips when Vgst is equal to Vsafe. In a specific embodiment, the ramp is stopped and data is latched. Referring to FIG. 7B, a current ramp as a function of time is shown for a cell in both the set state 752 and the reset state 754. In an embodiment, the current ramp is made to be variable over time, e.g., it exhibits a non linear slew rate.

Thus, a method of reading a phase-change memory cell may be provided. In accordance with an embodiment of the present invention, a method includes performing a current ramp on a bitline. The method also includes tripping a comparator when the current ramp provides a storage voltage with a predefined value, the storage voltage associated with a phase-change memory cell, and the predefined value independent from a resistance value of the phase-change memory cell. In one embodiment, performing the current ramp includes ramping current on a dummy bitline, the dummy bitline different from a bitline of the phase-change memory cell. In that embodiment, tripping the comparator includes providing the storage voltage from the dummy bitline. In a specific embodiment, performing the current ramp includes forcing the current ramp on both the dummy bitline and the bitline of the phase-change memory cell. In another specific embodiment, ramping current on the dummy bitline includes ramping a current on a bitline including a dummy phase-change memory cell. In another specific embodiment, ramping current on the dummy bitline includes ramping a current on a bitline with a dummy selector but absent a dummy phase-change storage memory cell. In one embodiment, the method further includes, prior to tripping the comparator, referencing a look-up table to determine the predefined value.

Figure 8:
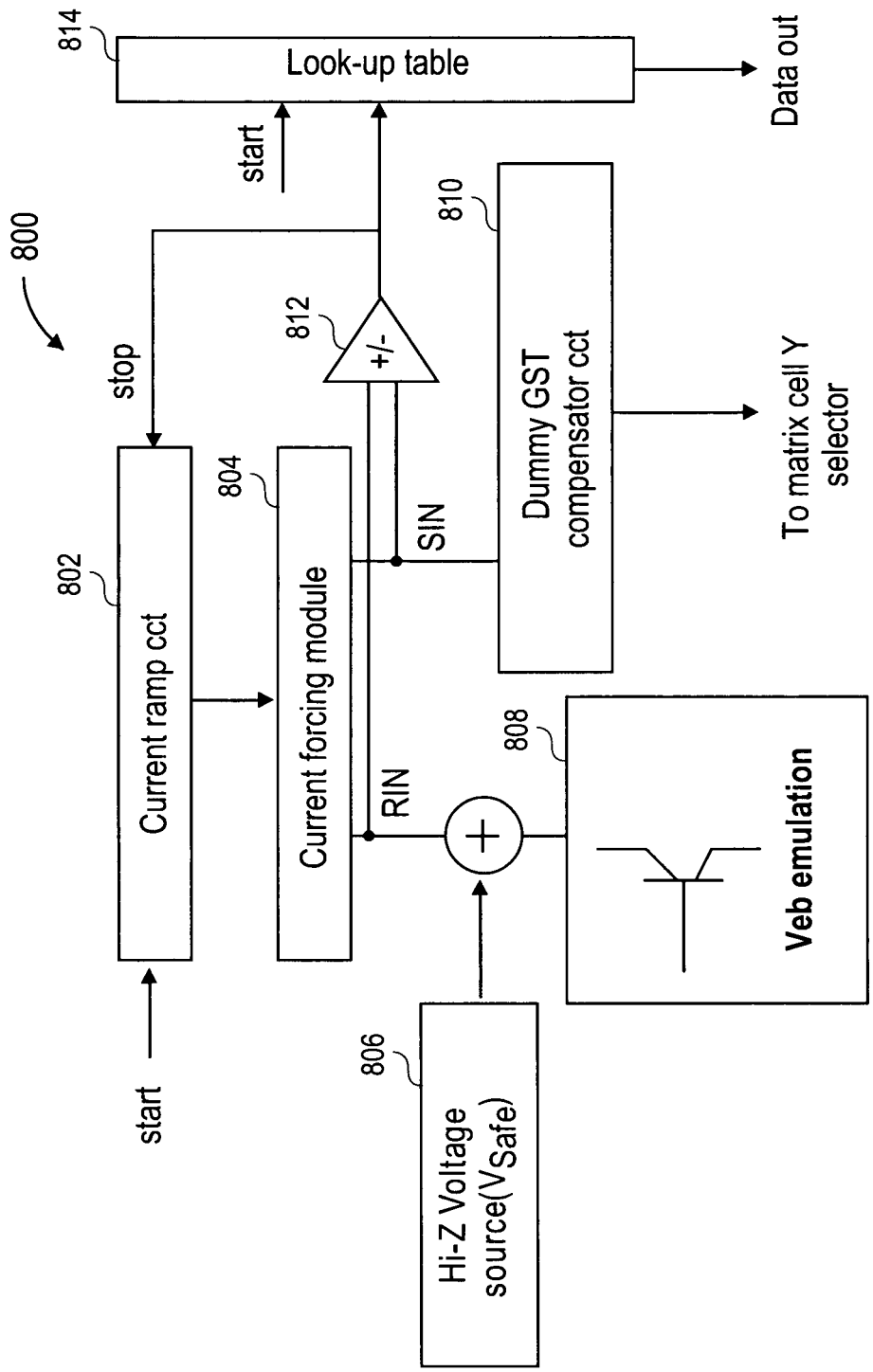
FIG. 8 illustrates a conceptual block diagram of a layout of an apparatus for reading a phase-change memory cell, in accordance with an embodiment of the present invention.

FIG. 8 illustrates a conceptual block diagram of a layout of an apparatus for reading a phase-change memory cell, in accordance with an embodiment of the present invention. Referring to FIG. 8, an apparatus 800 includes a current ramp circuit 802 coupled with a current forcing module 804. Current forcing module 804 is coupled with a high output impedance voltage source 806 (Vsafe) and an emitter base voltage emulation module 808 (which can be in a given embodiment a real dummy bitline BLD as shown in FIG. 4, connected to a dummy wordline WLD through a dummy cell) as well as with a dummy phase-change compensator circuit 810 (which can compensate Rgstd of dummy bitline, in case dummy bitline includes a dummy calchogenide material). In accordance with an embodiment of the present invention, a comparator 812 (whose inputs are RIN from emulation branch and SIN from the matrix branch) couples current forcing module 804, the sum of the high output impedance voltage source 806 and the Veb emulation 808 (RIN), and dummy phase-change compensator circuit 810 (SIN) with a look-up table 814. In one embodiment, dummy phase-change compensator circuit 810 includes a phase-change material. In another embodiment, dummy phase-change compensator circuit 810 does not include a phase-change material. In a specific embodiment, dummy phase-change compensator circuit 810 does not include a phase-change material but does include a trimable element such as, but not limited to, an NMOS or a diffusion resistor which emulates the dummy leg phase-change material into the Veb emulation 808, if any.

Thus, a circuit for reading a phase-change memory cell may be provided. In accordance with an embodiment of the present invention, a circuit includes a current ramp circuit coupled with a current forcing module. A Veb emulation circuit is coupled with the current forcing module via a voltage adder. In one embodiment, the Veb emulation circuit includes a dummy bitline different from a bitline of the phase-change memory cell. In a specific embodiment, the Veb emulation circuit further includes a dummy phase-change memory cell coupled with the dummy bitline through a dummy wordline. In another specific embodiment, the Veb emulation circuit does not include a dummy phase-change storage memory cell but a dummy wordline and a dummy selector are still present. In one embodiment, the circuit further includes a look-up table coupled, via a comparator, with the current forcing module, the sum of the Veb emulation, the high output impedance Voltage source (RIN), and the dummy phase-change compensator circuit (SIN). In one embodiment, the dummy GST compensator is not present (SIN is directly connected to the matrix Y select). In one embodiment, the phase-change memory cell is a multi-level phase-change memory cell.

Figure 9:
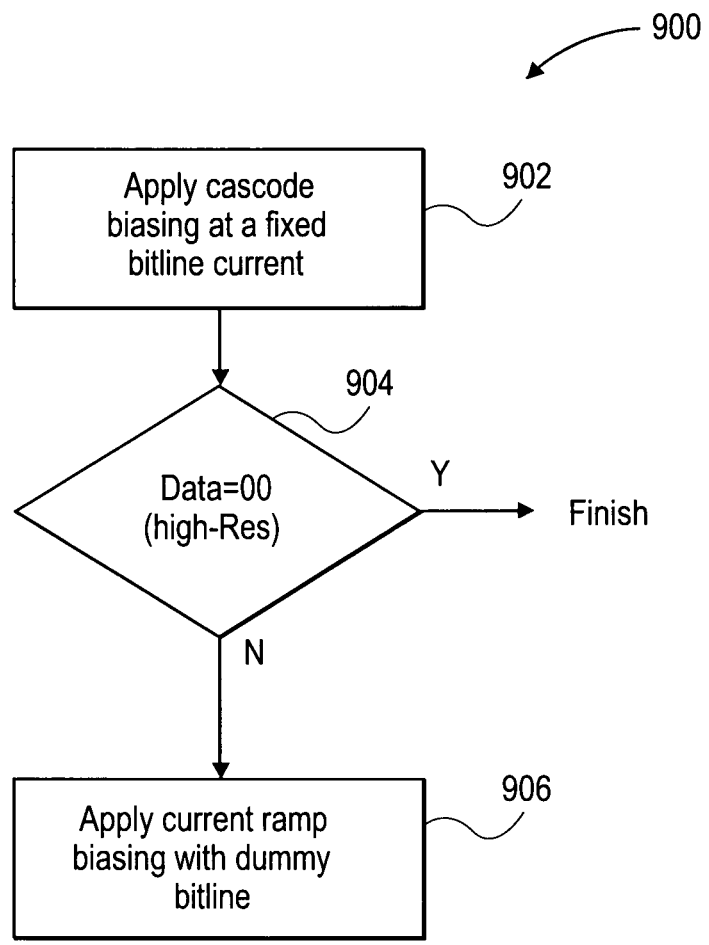
FIG. 9 illustrates a decision tree for a screen out plus current ramp approach to reading a phase-change memory cell, in accordance with an embodiment of the present invention.

In accordance with another embodiment of the present invention, a highest resistive value is first screened out. For example, in one embodiment, the highest resistive value is screened out by a conventional process such as, but not limited to, a cascode or operational amplifier scheme. In an embodiment, subsequent to the screening, a current ramp approach, such as one of the current ramp approaches described above is applied to a phase-change memory cell. FIG. 9 illustrates a decision tree for a first conventional screen out plus current ramp approach to reading a phase-change memory cell, in accordance with an embodiment of the present invention. Referring to FIG. 9, a decision tree 900 includes applying a cascode biasing 902 to a cell at a fixed bitline current. At decision 904, if the data is a highest resistive value, then the reading is complete. If at decision 904, however, the data is not a highest resistive value, then a current ramp biasing 906 with dummy bitline is applied.

In another aspect of the present invention, a look-up table is associated with a current ramp generation for reading a phase-change memory cell. In an embodiment, a look-up table is used to convert trigger pulses into digital information for, e.g., a multi-level read in a MLC. In one embodiment, a function such as, but not limited to, (bitn, ... bit0)=f(start, stop, ramp duration, ramp amplitude) is used in look-up table form. In a specific embodiment, a digital current ramp starts at "start" and stops at "stop" when a comparator triggers, e.g., when the storage voltage on the cell is equal to Vsafe.

Figure 10:
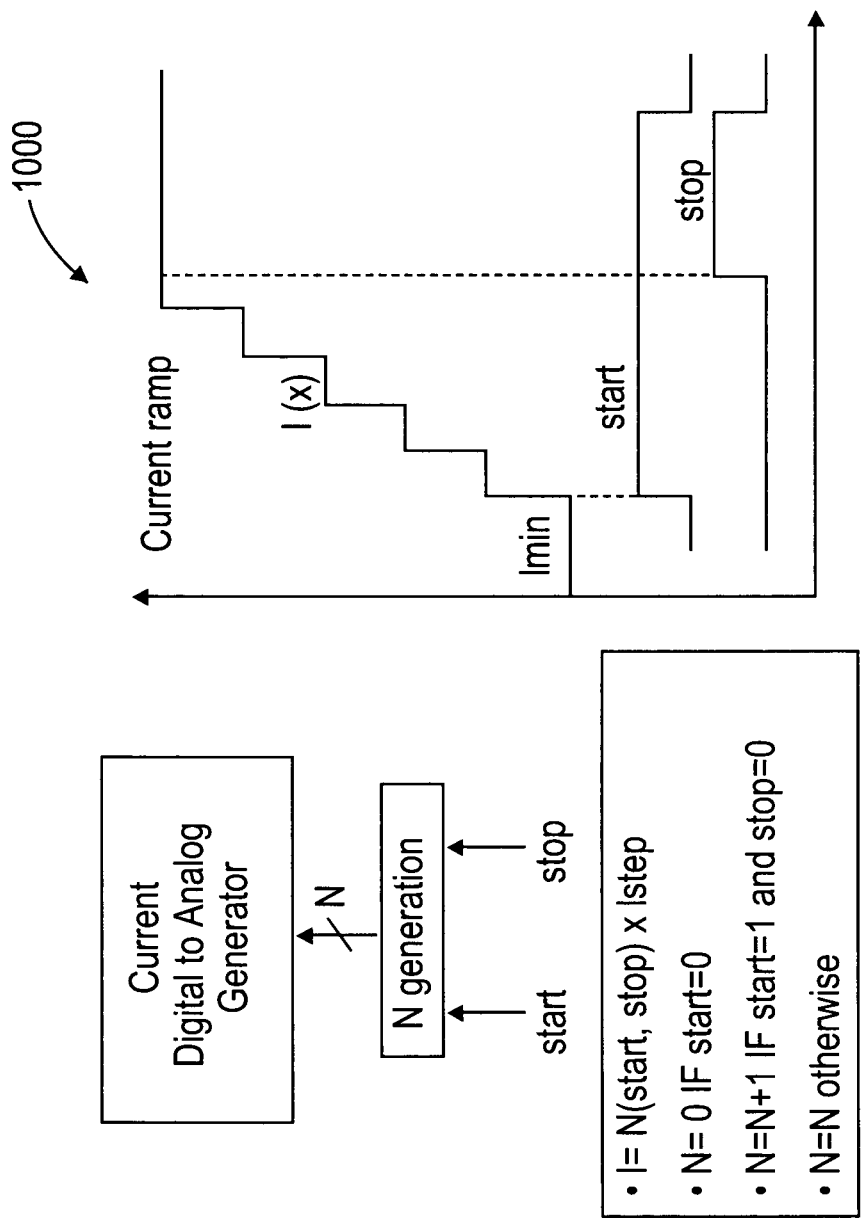
FIG. 10 illustrates conception diagrams for current ramp generation for reading a phase-change memory cell, in accordance with an embodiment of the present invention.

FIG. 10 illustrates conception diagrams for current ramp generation for reading a phase-change memory cell, in accordance with an embodiment of the present invention. Referring to FIG. 10, a current (I) is ramped step-wise under the algorithm I=N(start, stop)×Istep. In this approach, N is equal to zero if start equals zero. Then, N equals N+1 if start equals 1 and stop equals zero. Otherwise, N is equal to N. As depicted on the right-hand side graph 1000, current I ramps upward step-wise from Imin during the "start" timeframe.

Figure 11:
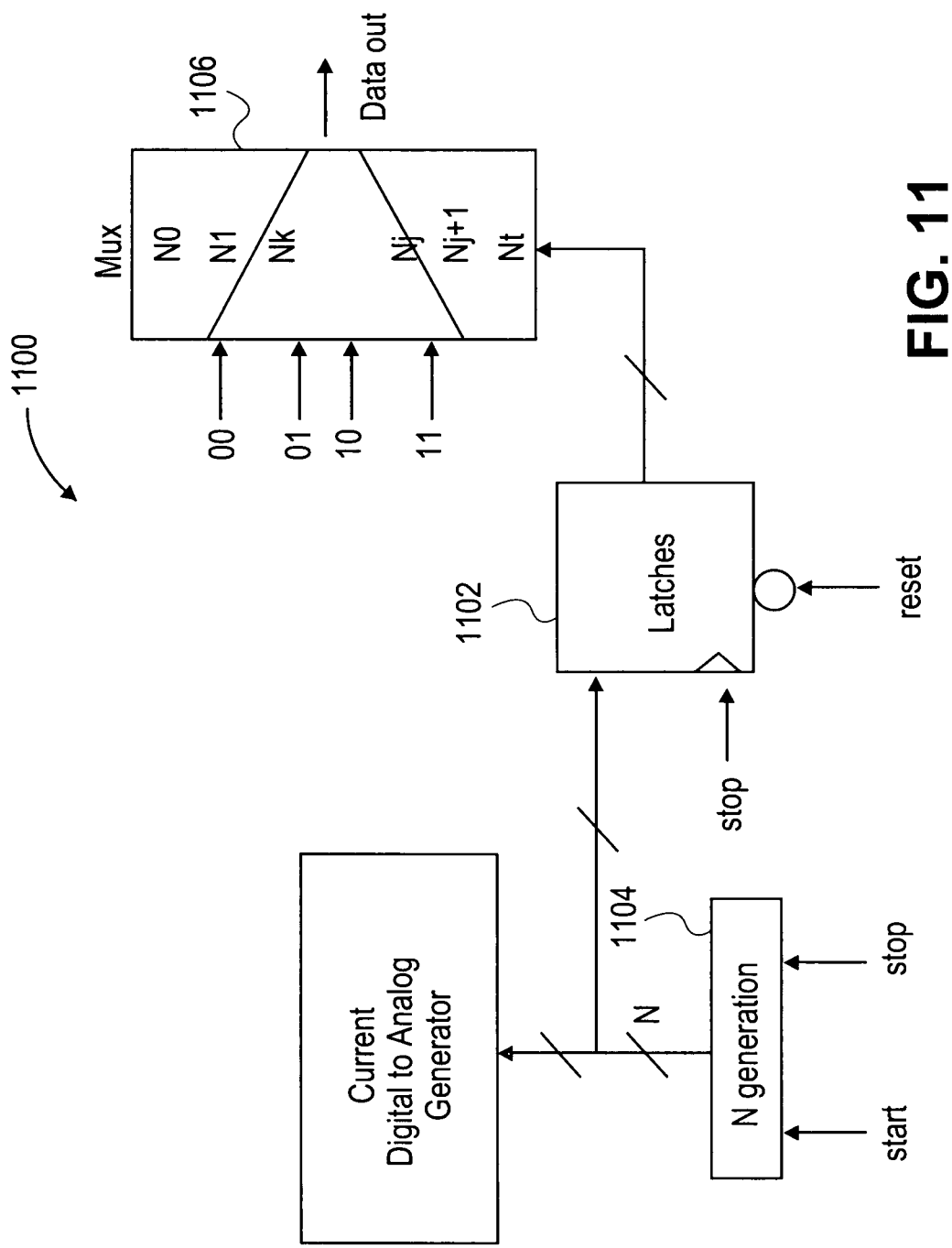
FIG. 11 illustrates a look-up table for current ramp generation and cell state detection during reading of a phase-change memory cell, in accordance with an embodiment of the present invention.

FIG. 11 illustrates a look-up table for current ramp generation and cell state detection during reading of a phase-change memory cell, in accordance with an embodiment of the present invention. Referring to FIG. 11, a circuit 1100 is coupled with a set of latches 1102. In accordance with an embodiment of the present invention, the set of latches 1102 is inside an N generator 1104, although it is depicted separately in FIG. 11. In one embodiment, a bitline associated with the set of latches 1102 is disconnected and grounded once a comparator is triggered. Referring again to FIG. 11, the set of latches 1102 is coupled with a Mux 1106. In an embodiment, the look-up table is associated with an MLC cell and data out is: 00 if N falls in the interval [N0, N1, ..., Nk], 01 if N falls in the interval [Nk+1, Nk+2, ..., Nj], 10 if N falls in the interval [Nj+1, Nj+2, ..., Nx], 11 if N falls in the interval [Nx+1, Nx+2, ..., Nt].

Figure 12:
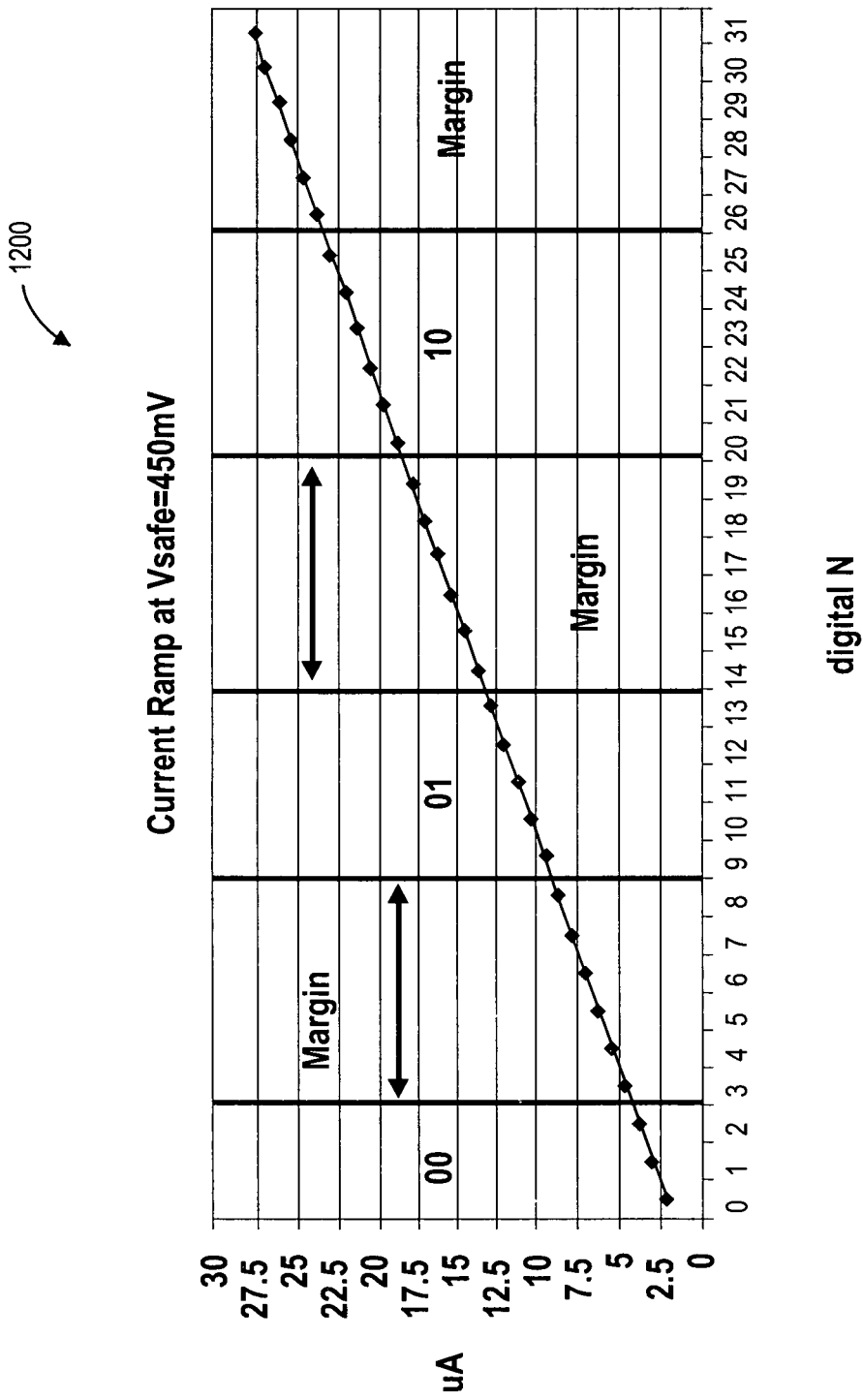
FIG. 12 illustrates exemplary output from a current ramp generation using a look-up table, the current ramp generation for reading a phase-change memory cell, in accordance with an embodiment of the present invention.

FIG. 12 illustrates exemplary output 1200 from a current ramp generation using a look-up table, the current ramp generation for reading a phase-change memory cell, in accordance with an embodiment of the present invention. In an embodiment, Vsafe equals 450 mV, Imin equals 2 microAmps, and Imax equals 30 microAmps. In an embodiment, referring again to FIG. 12, 32 levels are ramped by 0.8 microAmps each. It is to be understood that, being the output of the latch a digital representation of the step the trigger has happened in, and being such trigger related to that given current needed to the cell to have a Vsafe voltage dropping on its storage, this reading approach represents a close to analog way to sense the data stored into the memory. This can be further elaborated by correction state machines and memory controllers implementing sophisticated detection and correction algorithms, such as convolutional detection and correction algorithms.

Figure 13:
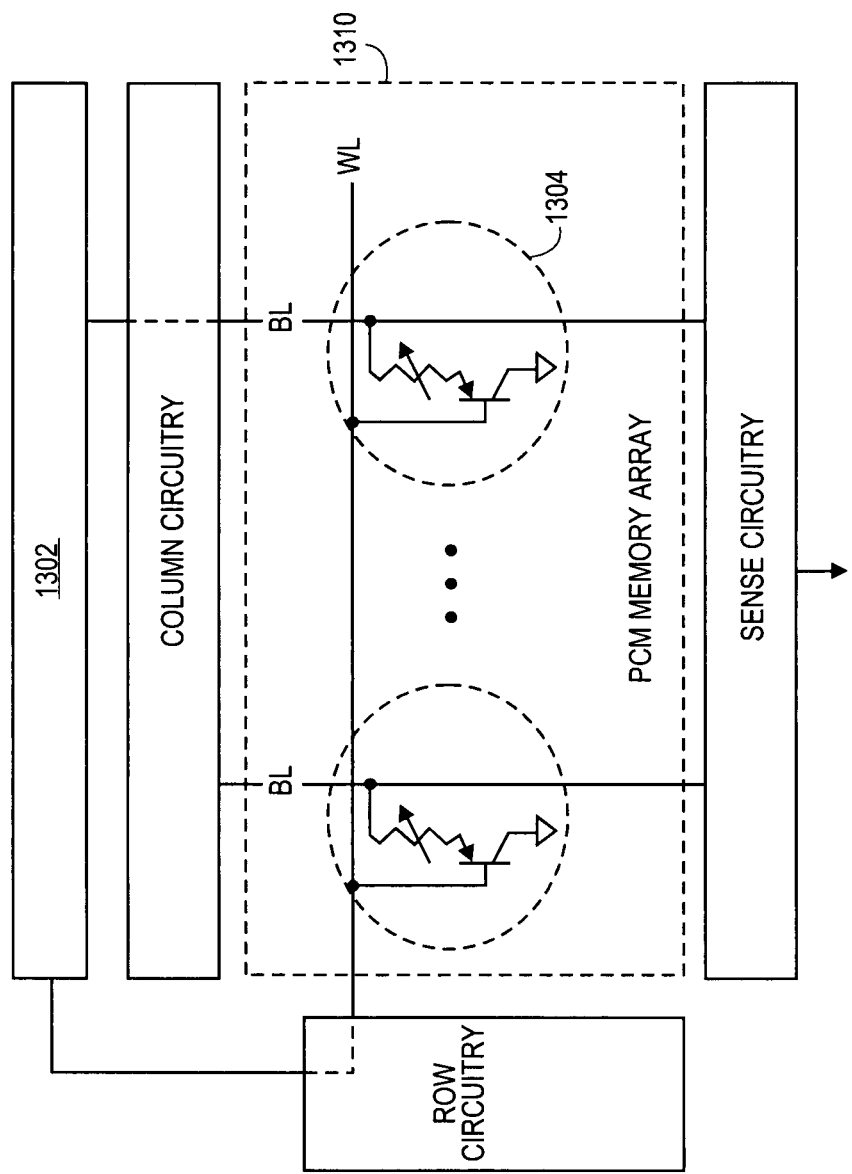
FIG. 13 illustrates an array of phase-change memory cells with at least one phase-change memory cell coupled to a circuit with a dummy bitline used for reading the phase-change memory cell, in accordance with an embodiment of the present invention.

In an aspect of the present invention, a phase-change memory cell array includes memory cells that are composed of a storage material in combination with a selector device. For example, FIG. 13 illustrates an array 1310 of phase-change memory cells, in accordance with an embodiment of the present invention. In an embodiment, array 1310 includes phase-change memory cells composed of alloys of elements of group VI of the periodic table, elements such as Te or Se that are referred to as chalcogenides or chalcogenic materials. Chalcogenides may be used advantageously in phase change memory cells to provide data retention and remain stable even after the power is removed from the nonvolatile memory. Taking the phase change material as $Ge_2Sb_2Te_5$ for example, two phases or more are exhibited having distinct electrical characteristics useful for memory storage. Array 1310 includes phase-change memory cells each having a selector device and a memory element. Although the array is illustrated with bipolar selector devices, it should be noted that alternative embodiments may use CMOS selector devices or diodes to identify and selectively change the electrical properties (e.g. resistance, capacitance, etc.) of the chalcogenide material through the application of energy such as, for example, heat, light, voltage potential, or electrical current. The chalcogenic material may be electrically switched between different states intermediate between the amorphous and the crystalline states, thereby giving rise to a multilevel storing capability. To alter the state or phase of the memory material, this embodiment illustrates a programming voltage potential that is greater than the threshold voltage of the memory select device that may be applied to the memory cell. An electrical current flows through the memory material and generates heat that changes the electrical characteristic and alters the memory state or phase of the memory material.

By way of example, heating the phase-change material to a temperature above 900° C. in a write operation places the phase change material above its melting temperature ($T_M$). Then, a rapid cooling places the phase-change material in the amorphous state that is referred to as a reset state where stored data may have a "0" value. Taking $Ge_2Sb_2Te_5$ as an example, the time between achieving the melting temperature Tm and quenching after the local heating to achieve the amorphous phase may be less than 50 nanoseconds. On the other hand, to program a memory cell from reset to set, the local temperature is raised higher than the crystallization temperature (Tx) for a time longer than 50 nanoseconds (for $Ge_2Sb_2Te_5$) to allow complete crystallization. The phase-change material in the crystalline form is referred to as a set state and stored data may have a "1" value. Thus, the cell can be programmed by setting the amplitude and pulse width of the current that will be allowed through the cell. In summary, a higher magnitude, fast pulse will amorphize the cell, whereas a moderate magnitude, longer pulse will allow the cell to crystallize. In a read operation, the bit line (BL) and word line (WL) are selected and an external current is provided to the selected memory cell. To read a chalcogenide memory device, the current difference resulting from the different device resistance is sensed. It is then determined whether data stored in the selected memory cell is a "1" or "0" based on a voltage change caused by a resistance of the phase-change material of the selected memory cell. It is to be appreciated that the association of reset and set with amorphous and crystalline states, respectively, is a convention and that at least an opposite convention may be adopted. In accordance with an embodiment of the present invention, a circuit 1302 with a dummy bitline used for reading a phase-change memory cell is coupled to at least one phase-change memory cell 1304 in array 1310.

Figure 14:
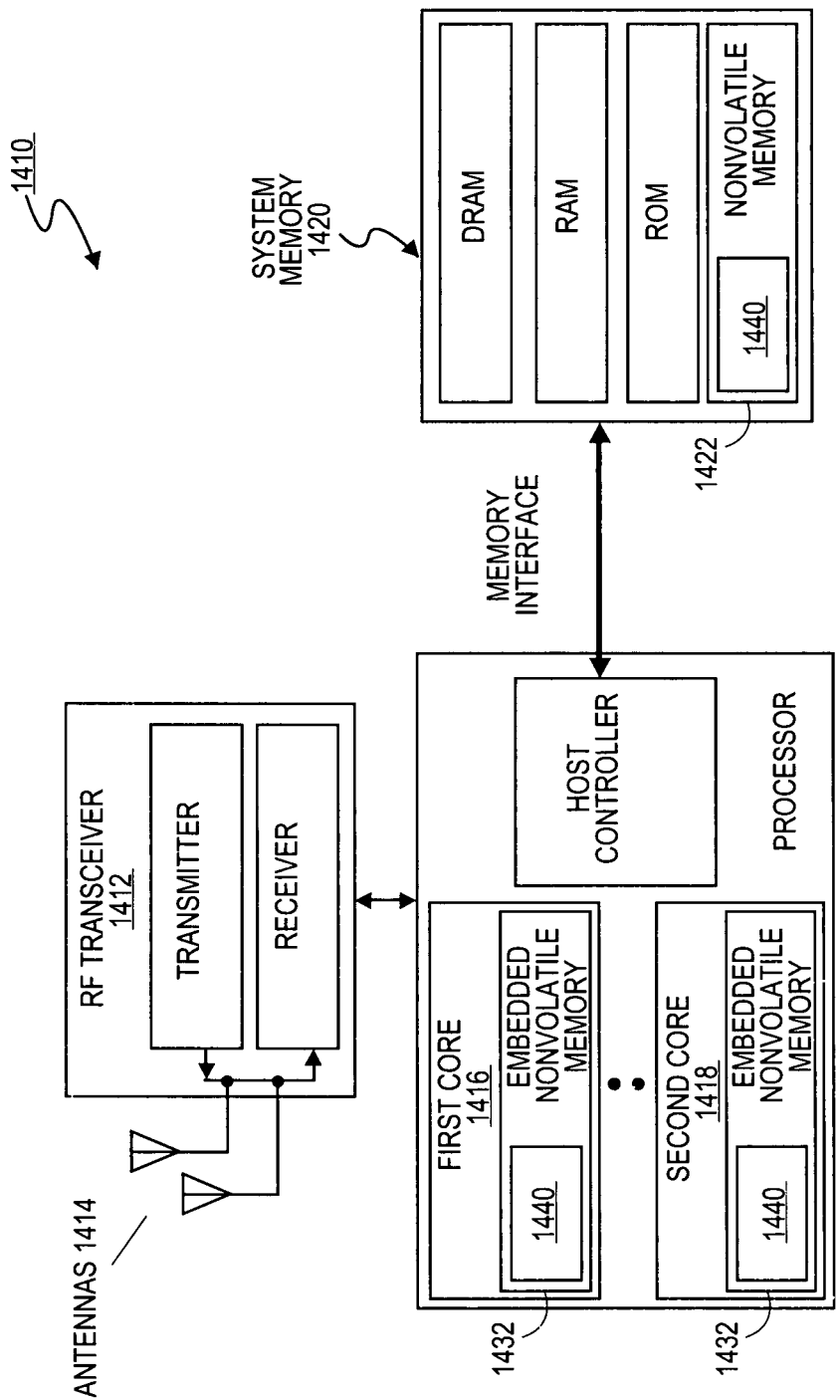
FIG. 14 illustrates a schematic representation of a wireless architecture that incorporates an array of phase-change memory cells with at least one phase-change memory cell coupled to a circuit with a dummy bitline and a dummy wordline used for reading the phase-change memory cell, in accordance with an embodiment of the present invention.

In another aspect of the present invention, FIG. 14 illustrates a schematic representation of a wireless architecture that incorporates an array of phase-change memory cells with at least one phase-change memory cell coupled to a circuit with a dummy bitline and a dummy wordline used for reading the phase-change memory cell, in accordance with an embodiment of the present invention. The wireless architecture embodiment illustrated in FIG. 14 shows a communications device 1410. It should be noted that the present invention is not limited to wireless communication embodiments and other, non-wireless applications may be used in conjunction with embodiments of the present invention (such as computing, data storage, consumer, automotive etc). As shown in this wireless embodiment, communications device 1410 includes one or more antenna structures 1414 to allow radios to communicate with other over-the-air communication devices. As such, communications device 1410 may operate as a cellular device or a device that operates in wireless networks such as, for example, Wireless Fidelity (Wi-Fi) that provides the underlying technology of Wireless Local Area Network (WLAN) based on the IEEE 802.11 specifications, WiMax and Mobile WiMax based on IEEE 802.16-2005, Wideband Code Division Multiple Access (WCDMA), and Global System for Mobile Communications (GSM) networks, although the present invention is not limited to operate in only these networks. The radio subsystems co-located in the same platform of communications device 1410 provide the capability of communicating with different frequency bands in an RF/location space with other devices in a network.

It should be understood that the scope of the present invention is not limited by the types of, the number of, or the frequency of the communication protocols that may be used by communications device 1410. However, by way of example, the embodiment illustrates the coupling of antenna structure 1414 to a transceiver 1412 to accommodate modulation/demodulation. In general, analog front end transceiver 1412 may be a stand-alone Radio Frequency (RF) discrete or integrated analog circuit, or transceiver 1412 may be embedded with a processor having one or more processor cores 1416 and 1418. The multiple cores allow processing workloads to be shared across the cores and handle baseband functions and application functions. An interface may be used to provide communication or information between the processor and the memory storage in a system memory 1420. Although the scope of the present invention is not limited in this respect, the interface may include serial and/or parallel buses to share information along with control signal lines to be used to provide handshaking between the processor and system memory 1420.

The system memory 1420 may optionally be used to store instructions that are executed by the processor during the operation of wireless communication device 1410, and may be used to store user data such as the conditions for when a message is to be transmitted by wireless communication device 1410 or the actual data to be transmitted. For example, the instructions stored in system memory 1420 may be used to perform wireless communications, provide security functionality for communication device 1410, user functionality such as calendaring, email, internet browsing, etc. System memory 1420 may be provided by one or more different types of memory and may include both volatile and a nonvolatile memory 1422 having a phase change material. Nonvolatile memory 1422 may be referred to as a Phase Change Memory (PCM), Phase-Change Random Access Memory (PRAM or PCRAM), Ovonic Unified Memory (OUM) or Chalcogenide Random Access Memory (C-RAM).

The volatile and nonvolatile memories may be combined in a stacking process to reduce the footprint on a board, packaged separately, or placed in a multi-chip package with the memory component placed on top of the processor. The embodiment also illustrates that one or more of the processor cores may be embedded with nonvolatile memory 1432. In accordance with an embodiment of the present invention, at least one phase-change memory cell in nonvolatile memory 1422 or 1432 is coupled to a circuit 1440 with a dummy bitline used for reading a phase-change memory cell and managed in the way described above, as depicted in FIG. 14.

Thus, a wireless communication device may be provided. In accordance with an embodiment of the present invention, a wireless communication device includes a transceiver to receive over-the-air signals, a processor core coupled to the transceiver, and a phase-change memory embedded with at least the processor core. The phase-change memory includes a circuit for reading a phase-change memory cell of the phase change memory. The circuit includes a current ramp circuit coupled with a current forcing module. A Veb emulation circuit is coupled with the current forcing module via a voltage adder (RIN node) which sums the Veb output and the high impedance voltage source (Vsafe). In one embodiment, the Veb emulation circuit includes a dummy bitline (BLD) different from a bitline of the phase-change memory cell. In a specific embodiment, the Veb emulation circuit further includes a dummy phase-change memory cell coupled with the dummy bitline through a dummy wordline (WLD). In another specific embodiment, the Veb emulation circuit does not include a dummy phase-change storage memory cell but a dummy wordline and a dummy selector are still present. In one embodiment, the circuit further includes a look-up table coupled, via a comparator, with the current forcing module, the sum of the Veb emulation and the high output impedance voltage source (RIN node) and the dummy phase-change compensator circuit (SIN node). In one embodiment the dummy GST compensator is not present and SIN node directly connects the matrix Y select (and by them, the bitline of the memory cell) to the current forcing module.

Thus, an apparatus and a method for reading a phase-change memory cell have been disclosed. Advantages of the approaches described herein may include one or more of the following: (1) that each cell is read (comparator generates a trigger) when the voltage is equal to Vsafe and, hence, every cell is biased at Vsafe independent from the resistance value of a phase-change memory material at a particular cell, (2) the current read window is maximized, enabling ease of placement for MLC inner states, (3) any temperature sensitivity due to bipolar Veb is minimized to nullified, (4) wordline IR (ohmic) drops which introduce read pattern dependencies are minimized or nullified, and (5) suitability for low voltage implantations, e.g., 1.8 Volt implementations. In accordance with an embodiment of the present invention, a method includes performing a current ramp. The method also includes tripping a comparator when the current ramp provides a storage voltage with a predefined value, the storage voltage associated with the phase-change memory cell, and the predefined value independent from a resistance value of the phase-change memory cell. In one embodiment, performing the current ramp includes ramping current on a dummy bitline, the dummy bitline different from a bitline of the phase-change memory cell. Meanwhile, tripping the comparator includes providing the storage voltage from the dummy bitline. In a specific embodiment, performing the current ramp includes forcing the current ramp on both the dummy bitline and the bitline of the phase-change memory cell.

In an embodiment, a method includes a forcing current ramp into both a bitline and a dummy bitline, and triggering a comparator which stops the ramp when a storage voltage reaches a predefined value independent on the value of a storage resistance, while depending on a safe voltage added in series to the dummy bitline voltage.

In an embodiment, an apparatus includes a current ramp generator coupled with a 2 legs current forcing means, the current forcing means coupled with a first leg (RIN node) being the sum of an high impedance output voltage source (Vsafe) and a Veb emulation (generated with a dummy bitline, dummy wordline and dummy cell in the preferred embodiment), and a second leg (SIN node), coupled with a dummy gst compensator. The dummy gst compensator connects that leg to the top of the memory column selectors and through those selectors to the memory bitline. The two legs are connected to the inputs of a comparator whose output is fed back to the current ramp and to a look-up table in order to implement a cell reading method.

What is claimed is:

1. A circuit for reading a phase-change memory cell, the circuit comprising:
   a current ramp circuit;
   a current forcing module coupled with the current ramp circuit; and
   a Veb emulation circuit coupled with the current forcing module by a voltage adder, the voltage adder to sum an output from the Veb emulation circuit and a high impedance voltage source.

2. The circuit of claim 1, wherein the Veb emulation circuit comprises a dummy bitline different from a bitline of the phase-change memory cell.

3. The circuit of claim 2, wherein the Veb emulation circuit further comprises a dummy phase-change memory cell comprising a dummy cell storage and a dummy cell selector, the dummy phase-change memory cell coupled with the dummy bitline through a dummy wordline.

4. The circuit of claim 2, wherein the Veb emulation circuit further comprises a dummy wordline and a dummy cell selector, but not a dummy phase-change storage memory cell.

5. The circuit of claim 1, further comprising:
   a look-up table coupled, via a comparator, with the current forcing module and the Veb emulation circuit.

6. The circuit of claim 1, wherein the phase-change memory cell is a single-level phase-change memory cell.

7. The circuit of claim 1, wherein the phase-change memory cell is a multi-level phase-change memory cell.

8. A method of reading a phase-change memory cell, the method comprising:
   forcing a current ramp into both a bitline and a dummy bitline, the dummy bitline having a voltage; and
   tripping a comparator when the current ramp provides a storage voltage with a predefined value, the storage voltage associated with the phase-change memory cell, and the predefined value independent from a resistance value of the phase-change memory cell and added in series to the voltage of the dummy bitline.

9. The method of claim 8, wherein performing the current ramp comprises ramping current on a dummy bitline, the dummy bitline different from a bitline of the phase-change memory cell, and wherein tripping the comparator comprises providing the storage voltage from the dummy bitline.

10. The method of claim 9, wherein performing the current ramp comprises forcing the current ramp on both the dummy bitline and the bitline of the phase-change memory cell.

11. The method of claim 8, wherein performing the current ramp comprises ramping current on a dummy bitline comprising a dummy phase-change memory cell comprising a dummy storage and a dummy selector, the dummy phase-change memory cell coupled with the dummy bitline through a dummy wordline.

12. The method of claim 8, wherein performing the current ramp comprises ramping current on a dummy bitline comprising a dummy wordline and a dummy selector, but not a dummy phase-change storage memory cell.

13. The method of claim 8, further comprising:
   prior to tripping the comparator, referencing a look-up table to determine the predefined value.

14. A system, comprising:
   a processor core; and
   a phase-change memory embedded with at least the processor core, the phase-change memory comprising a circuit for reading a phase-change memory cell of the phase change memory, the circuit comprising:
      a current ramp circuit;
      a current forcing module coupled with the current ramp circuit; and
      a Veb emulation circuit coupled with the current forcing module by a voltage adder, the voltage adder to sum an output from the Veb emulation circuit and a high impedance voltage source.

15. The system of claim 14, wherein the Veb emulation circuit comprises a dummy bitline different from a bitline of the phase-change memory cell.

16. The system of claim 15, wherein the Veb emulation circuit further comprises a dummy phase-change memory cell comprising a dummy cell storage and a dummy cell selector, the dummy phase-change memory cell coupled with the dummy bitline through a dummy wordline.

17. The system of claim 15, wherein the Veb emulation circuit further comprises a dummy wordline and a dummy selector, but not a dummy phase-change storage memory cell.

18. The system of claim 14, the circuit further comprising:
   a look-up table coupled, via a comparator, with the current forcing module and the Veb emulation circuit.

19. The system of claim 14, wherein the system is a wireless communication device, the wireless communication device, comprising:
   a transceiver to receive over-the-air signals, wherein the processor core is coupled to the transceiver, and wherein the phase-change memory cell is a single-level phase-change memory cell.

20. The system of claim 14, wherein the system is a wireless communication device, the wireless communication device, comprising:
   a transceiver to receive over-the-air signals, wherein the processor core is coupled to the transceiver, and wherein the phase-change memory cell is a multi-level phase-change memory cell.

* * * * *